US006848194B2

(12) United States Patent
Treur

(10) Patent No.: US 6,848,194 B2
(45) Date of Patent: Feb. 1, 2005

(54) APPARATUS FOR MONITORING A SEMICONDUCTOR WAFER DURING A SPIN DRYING OPERATION

(75) Inventor: Randolph E. Treur, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 319 days.

(21) Appl. No.: 10/353,402

(22) Filed: Jan. 28, 2003

(65) Prior Publication Data

US 2003/0110658 A1 Jun. 19, 2003

Related U.S. Application Data

(62) Division of application No. 09/752,614, filed on Dec. 27, 2000, now Pat. No. 6,558,964.

(51) Int. Cl.[7] .............................................. F26B 17/24
(52) U.S. Cl. ............................................ 34/58; 34/528
(58) Field of Search ..................... 34/527, 528, 529, 34/58, 88, 89; 438/14, 15, 782, 974; 356/239.7, 237.2, 237.4, 237.5

(56) References Cited

U.S. PATENT DOCUMENTS

| | | | | |
|---|---|---|---|---|
| 4,313,266 A | * | 2/1982 | Tam ............................. 34/317 |
| 5,308,447 A | | 5/1994 | Lewis et al. ................. 156/626 |
| 5,719,495 A | | 2/1998 | Moslehi ..................... 324/158.1 |
| 5,851,041 A | * | 12/1998 | Anderson et al. ........... 294/106 |
| 5,872,633 A | | 2/1999 | Holzapfel et al. ........... 356/381 |
| 5,911,619 A | | 6/1999 | Uzoh et al. ...................... 451/5 |
| 6,172,749 B1 | * | 1/2001 | Watanabe ................. 356/237.4 |
| 6,257,953 B1 | | 7/2001 | Gitis et al. ....................... 451/5 |
| 6,269,510 B1 | | 8/2001 | Beardsley et al. .............. 15/77 |
| 6,431,769 B1 | | 8/2002 | Fukuda et al. ............... 396/611 |
| 6,558,964 B2 | * | 5/2003 | Treur ........................... 438/14 |
| 6,578,853 B1 | * | 6/2003 | Treur et al. .................. 279/121 |

FOREIGN PATENT DOCUMENTS

| EP | 0 428 784 A1 | 5/1991 |
|---|---|---|
| EP | 0 863 438 A1 | 9/1998 |

OTHER PUBLICATIONS

Abstract of Japanese Patent Publication No. 03–022531 A, Patent Abstracts of Japan, vol. 015, No. 147, Jan. 30, 1991.
"Spin Dryer Completion Detection System," IBM Technical Disclosure Bulletin, IBM Corp., vol. 36, No. 4, pp. 311–312, Apr. 1, 1993.

* cited by examiner

*Primary Examiner*—Pamela A Wilson
(74) *Attorney, Agent, or Firm*—Martine & Penilla, LLP

(57) ABSTRACT

An apparatus for spin drying a semiconductor wafer includes a hollow core spindle and a chuck assembly having grippers for supporting a wafer at an edge thereof. A sleeve is disposed in the central opening of the spindle and a manifold is disposed in the upper end of the sleeve. A capacitance sensor is affixed to the manifold. In another apparatus, an arm having a capacitance sensor mounted thereon is positioned such that the capacitance sensor is disposed above a space to be occupied by a wafer that is supported by the grippers. An additional apparatus includes an arm having a light source and a detector mounted thereon. The light source directs light toward a surface of a wafer such that light that reflects off of the surface is substantially perpendicular to that surface. The detector is positioned to measure the intensity of the reflected light.

14 Claims, 7 Drawing Sheets

| A | FLUID FILM PRESENT |
| B | FLUID FILM REDUCING |
| C | FLUID FILM REMOVED |

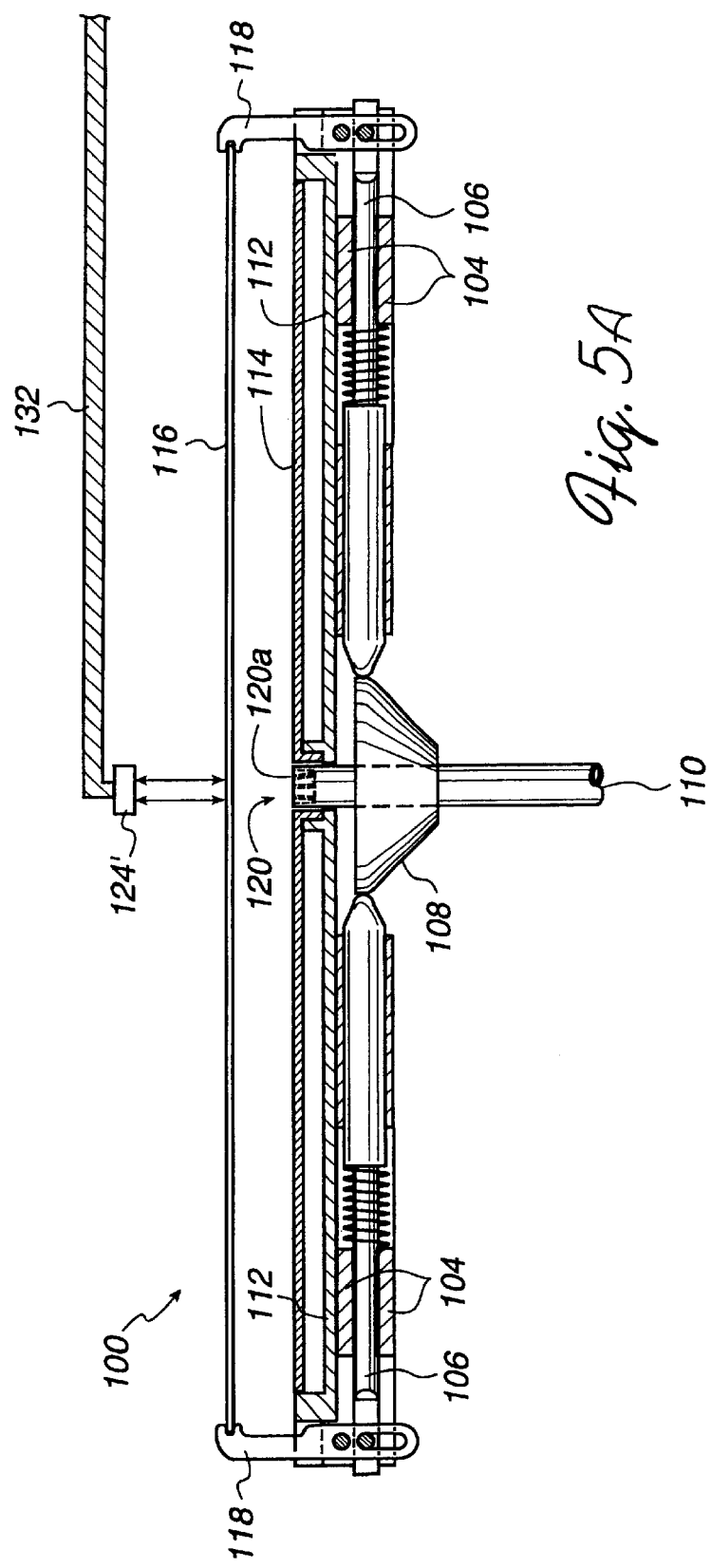

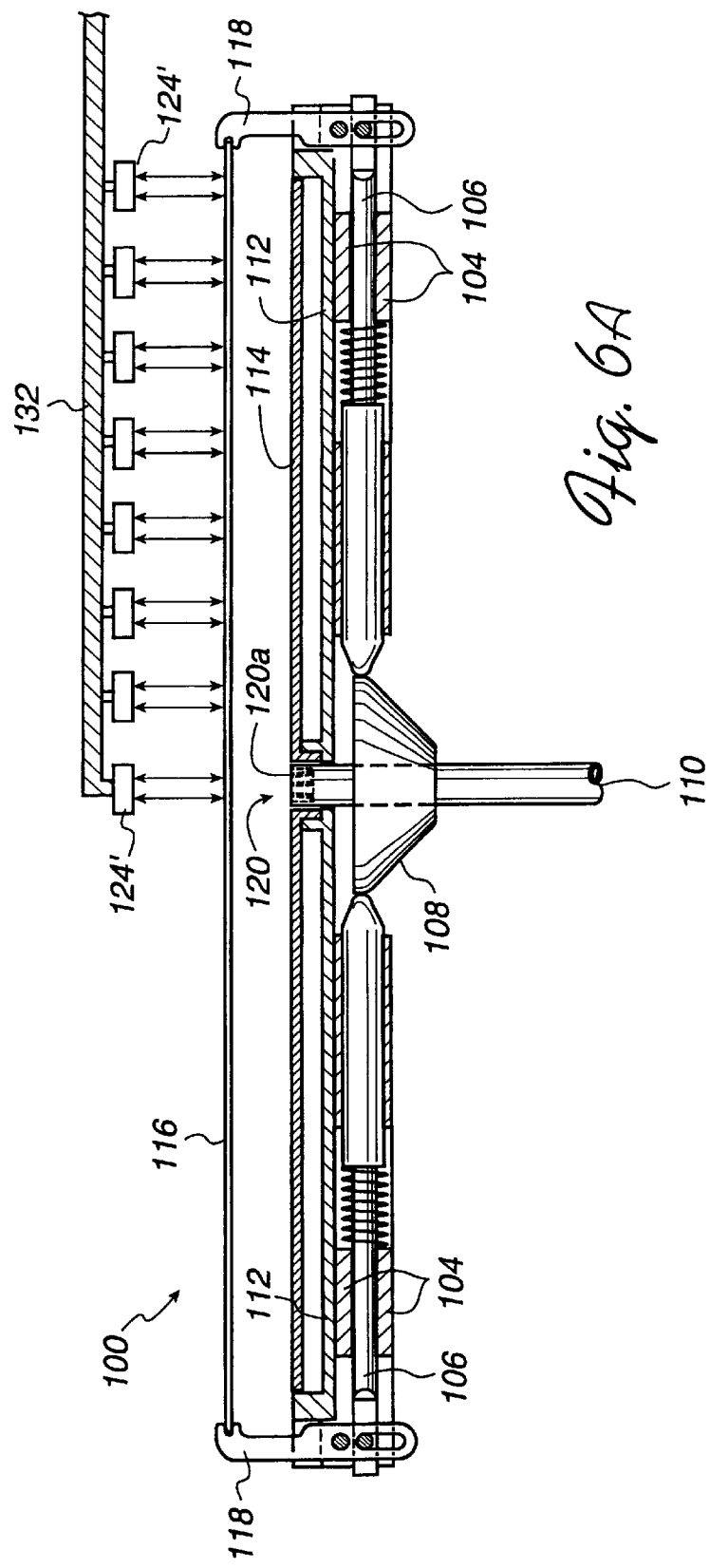

APPARATUS FOR MONITORING A SEMICONDUCTOR WAFER DURING A SPIN DRYING OPERATION

CROSS-REFERENCE TO RELATED APPLICATION

This application is a divisional of U.S. application Ser. No. 09/752,614, filed on Dec. 27, 2000, now U.S. Pat. No. 6,558,964 B2 the disclosure of which is incorporated herein by reference.

BACKGROUND OF THE INVENTION

The present invention relates generally to semiconductor fabrication and, more particularly, to a method for monitoring a semiconductor wafer during a spin drying operation, a method for spin drying a semiconductor wafer, and an apparatus for spin drying a semiconductor wafer.

In the fabrication of semiconductor devices, a variety of wafer preparation operations are performed. In conventional wafer cleaning systems, the wafers are scrubbed in a brush station, which typically includes a first brush box and a second brush box. A wafer is first scrubbed in the first brush box in a solution containing specified chemicals and deionized (DI) water. After being moved into the second brush box, the wafer is again scrubbed in a solution containing specified chemicals and DI water. The wafer is then moved into a spin, rinse, and dry (SRD) station where DI water is sprayed onto the top and bottom surfaces of the wafer as the wafer is spun. Once the wafer has been thoroughly rinsed, a spin drying operation is performed to dry the top and bottom surfaces of the wafer.

The spin drying operation must thoroughly dry the top and bottom surfaces of the wafer. If the spin drying operation is stopped prematurely, i.e., before the surfaces of the wafer are thoroughly dry, then the fluid remaining on the surfaces of the wafer may adversely affect subsequent fabrication operations. On the other hand, if the spin drying operation lasts longer than necessary to dry the surfaces of the wafer thoroughly, then the throughput productivity of the wafer cleaning system suffers. In conventional wafer cleaning systems, spin drying operations are not monitored to determine precisely when the surfaces of the wafer are thoroughly dry. Consequently, these wafer cleaning systems run the risk of either stopping the spin drying operation prematurely or unnecessarily extending the length of the spin drying operation.

In view of the foregoing, there is a need for a method for determining precisely when the surfaces of the wafer are thoroughly dry in a spin drying operation. In addition, there is a need for a method and apparatus for spin drying a semiconductor wafer that enables the spin drying operation to be stopped precisely when the surfaces of the wafer are thoroughly dry.

SUMMARY OF THE INVENTION

Broadly speaking, the present invention fills these needs by providing methods for monitoring a semiconductor wafer during a spin drying operation to determine precisely when the surface (or surfaces) of the wafer are dry. The present invention also provides methods and apparatus for spin drying a semiconductor wafer that enable the spin drying operation to be stopped precisely at the "endpoint" of the operation, i.e., the point at which the surface (or surfaces) of the wafer are dry.

In accordance with one aspect of the present invention, a first method for monitoring a semiconductor wafer during a spin drying operation is provided. In this method, a capacitance value between a capacitance sensor and the wafer is measured as the wafer is being spun to dry a surface thereof. When it is determined that the measured capacitance value has reached a substantially constant level, a signal is generated indicating that the surface of the wafer is dry. In one embodiment, spinning of the wafer is stopped in response to the signal.

In accordance with another aspect of the present invention, a first method for spin drying a semiconductor wafer is provided. This method includes spinning the wafer to dry a surface thereof. As the wafer is spinning, the capacitance value between a capacitance sensor and the wafer is measured. When it is determined that the measured capacitance value has reached a substantially constant level, a signal is generated. In response to the signal, spinning of the wafer is stopped.

In accordance with a further aspect of the present invention, a second method for monitoring a semiconductor wafer during a spin drying operation is provided. In this method, light is directed toward a surface of the wafer as the wafer is being spun to dry a surface thereof. The light is directed such that the light that reflects off of the surface of the wafer is substantially perpendicular to the surface of the wafer. The intensity of the light reflected off of the surface of the wafer is measured. A signal indicating that the surface of the wafer is dry is generated when the measured intensity of the light reflected off of the surface of the wafer reaches an intensity level that corresponds to a measured intensity of light reflected off of the surface of the wafer when the surface is dry.

In one embodiment, spinning of the semiconductor wafer is stopped in response to the signal. In one embodiment, the measured intensity of light reflected off of the surface of the wafer when the surface is dry is determined in a calibration operation.

In accordance with a still further aspect of the present invention, a second method for spin drying a semiconductor wafer is provided. This method includes spinning the wafer to dry a surface thereof. As the wafer is spinning, light is directed toward a surface of the wafer such that the light that reflects off of the surface of the wafer is substantially perpendicular to the surface of the wafer. The intensity of the light reflected off of the surface of the wafer is measured. A signal indicating that the surface of the wafer is dry is generated when the measured intensity of the light reflected off of the surface of the wafer reaches an intensity level that corresponds to a measured intensity of light reflected off of the surface of the wafer when the surface is dry. In response to the signal, spinning of the wafer is stopped. In one embodiment, the measured intensity of light reflected off of the surface of the wafer when the surface is dry is determined in a calibration operation.

In accordance with yet another aspect of the present invention, a first apparatus for spin drying a semiconductor wafer is provided. The apparatus includes a hollow core spindle having a central opening therethrough. A chuck assembly is mounted on the spindle. The chuck assembly has a central opening therethrough and includes grippers for supporting a wafer at an edge thereof. A sleeve is disposed in the central opening of the hollow core spindle such that an upper end thereof extends through the central opening of the chuck assembly. A manifold is disposed in the upper end of the sleeve. A capacitance sensor configured to measure a capacitance value between the wafer and the capacitance sensor is affixed to the manifold. In one embodiment, the apparatus further includes a processor for determining when the capacitance value measured by the capacitance sensor reaches a substantially constant level.

In accordance with a still further aspect of the present invention, a second apparatus for spin drying a semiconductor wafer is provided. This apparatus includes a spindle and a chuck assembly mounted on the spindle. The chuck assembly includes grippers for supporting a wafer at an edge thereof. An arm having a capacitance sensor mounted thereon is positioned such that the capacitance sensor is disposed above a space to be occupied by a wafer that is supported by the grippers. The capacitance sensor is configured to measure a capacitance value between a wafer supported by the grippers and the capacitance sensor.

In one embodiment, the apparatus further includes a processor for determining when the capacitance value measured by the capacitance sensor reaches a substantially constant level. In one embodiment, the arm is movable so that the position of the capacitance sensor relative to the space to be occupied by a wafer that is supported by the grippers can be varied. In one embodiment, the arm has a plurality of capacitance sensors mounted thereon. Each of the capacitance sensors is disposed above a space to be occupied by a wafer that is supported by the grippers, and each of the capacitance sensors is configured to measure a capacitance value between a wafer supported by the grippers and the capacitance sensor.

In accordance with yet another aspect of the present invention, a third apparatus for spin drying a semiconductor wafer is provided. This apparatus includes a spindle and a chuck assembly mounted on the spindle. The chuck assembly includes grippers for supporting a wafer at an edge thereof. The apparatus further includes an arm having a light source and a detector mounted thereon. The light source is positioned to direct light toward a surface of a wafer being supported by the grippers such that light that reflects off of the surface of the wafer is substantially perpendicular to the surface of the wafer. The detector is positioned to measure an intensity of the light reflected off of the surface of the wafer.

In one embodiment, the apparatus further includes a processor for determining when the measured intensity of the light reflected off of the surface of the wafer reaches an intensity level that corresponds to a measured intensity of light reflected off of the surface of the wafer when the surface is dry. In one embodiment, the arm is movable so that the position of the light source and the detector relative to the surface of the wafer can be varied. In one embodiment, the arm has a plurality of light sources and a corresponding number of detectors mounted thereon. Each of the light sources is positioned to direct light toward a surface of a wafer being supported by the grippers such that light that reflects off of the surface of the wafer is substantially perpendicular to the surface of the semiconductor wafer. Each of the detectors is positioned to measure an intensity of the light from a corresponding light source that has reflected off of the surface of the wafer.

The methods and apparatus of the present invention minimize the risk of either stopping a spin drying operation prematurely or unnecessarily extending the length of a spin drying operation. Thus, the methods and apparatus of the present invention advantageously improve the yield and throughput productivity in the manufacturing of semiconductor devices.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 5A is a side view, which shows some components in cross-section and other components in perspective view, of an arm having a capacitance sensor mounted thereon disposed above an exemplary chuck assembly in accordance with one embodiment of the invention.

FIG. 6A is a side view, which shows some components in cross-section and other components in perspective view, of an arm having a plurality of capacitance sensors mounted thereon disposed above an exemplary chuck assembly in accordance with one embodiment of the invention.

DETAILED DESCRIPTION OF EXEMPLARY EMBODIMENTS

Several exemplary embodiments of the invention will now be described in detail with reference to the accompanying drawings.

Figure 1:
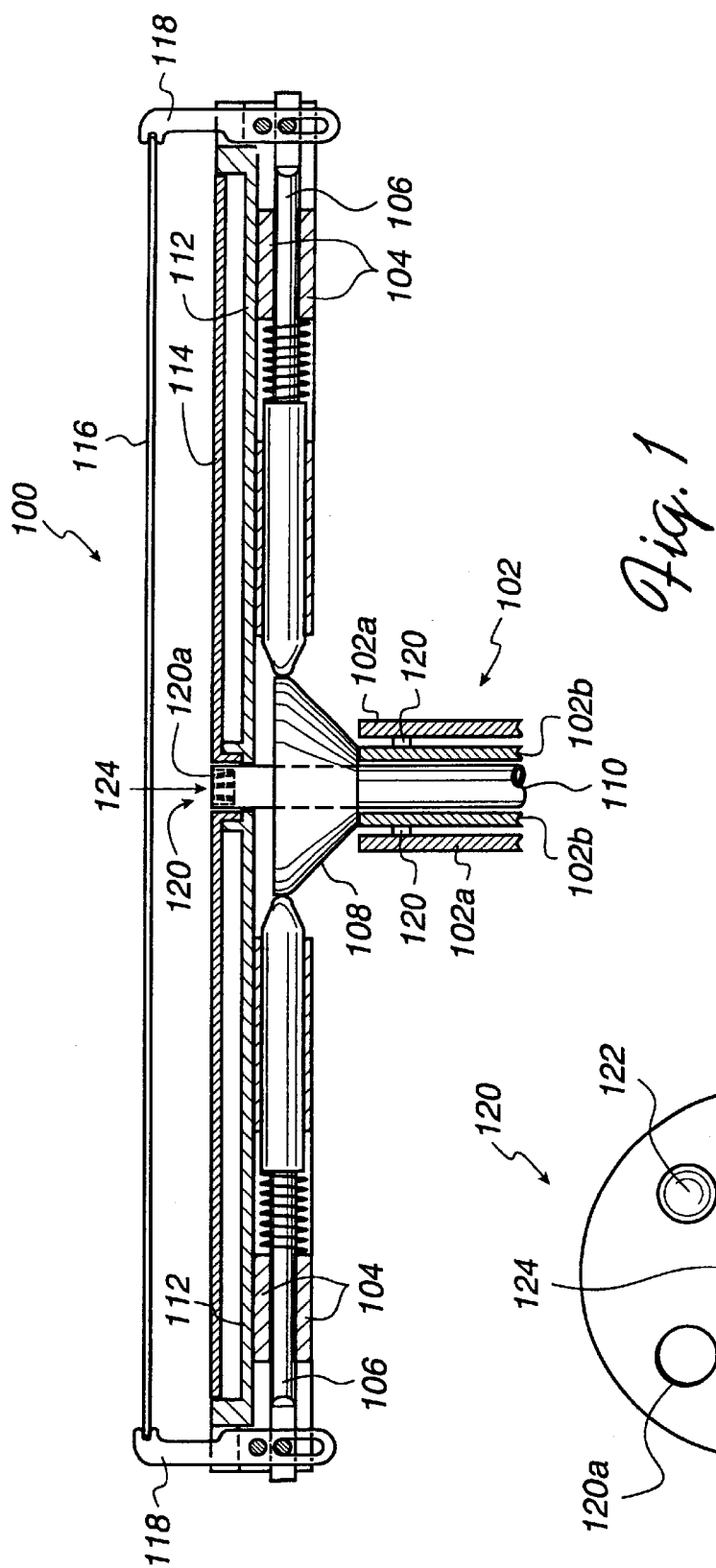
FIG. 1 is a side view, which shows some components in cross-section and other components in perspective view, of an exemplary chuck assembly and hollow core spindle that includes a capacitance sensor in accordance with one embodiment of the invention.

FIG. 1 is a side view, which shows some components in cross-section and other components in perspective view, of an exemplary chuck assembly and hollow core spindle that includes a capacitance sensor in accordance with one embodiment of the invention. As shown therein, chuck assembly 100 is mounted on hollow core spindle 102. Chuck assembly 100 includes chuck body 104, which includes a plurality of spokes, and link arms 106, which are situated in the spokes of the chuck body. The inner end of each link arm 106 is configured to slide along the sidewall of wedge 108, which is slidably mounted on sleeve 110, as explained in more detail below. Chuck top plate 112 sits on top of chuck body 104 and covers the moving parts of link arms 106. Wafer backside plate 114 is attached to chuck top plate 112 and sits just below the surface of semiconductor wafer 116. Grippers 118, which are pivotably mounted on chuck body 104, support wafer 116 at an edge thereof. To release wafer 116, grippers 118 are pivoted into an open position by sliding wedge 108 upwardly along sleeve 110. As wedge 108 moves upwardly, link arms 106 slide inwardly along the sidewall of the wedge and thereby cause grippers 118 to pivot into the open position. Additional details regarding the structure and operation of chuck assembly 100 are set forth in U.S. application Ser. No. 09/747,665, filed on Dec. 22, 2000, and entitled "Chuck Assembly for use in a Spin, Rinse, and Dry Module and Methods for Making and Implementing the Same". The disclosure of this application, which is assigned to Lam Research Corporation, the assignee of the subject application, is incorporated herein by reference.

Hollow core spindle 102 includes rotary shaft 102*a* and linear shaft 102*b*, which is coaxially disposed within rotary shaft 102*a*. As is well known to those skilled in the art, hollow core spindle 102 is coupled to a motor (not shown) that provides rotational power to rotary shaft 102*a*. In operation, both rotary shaft 102*a* and linear shaft 102*b* rotate, with the rotational power provided to rotary shaft 102*a* being transferred to linear shaft 102*b* by pins 120. Linear shaft 102*b*, which is coupled to wedge 108, also moves up and down to adjust the position of the wedge and thereby cause the grippers to pivot between open and closed positions, as described above. Additional details regarding the structure and operation of a hollow core spindle are set forth in U.S. application Ser. No. 09/470,690, filed on Dec. 23, 1999, and entitled "Hollow Core Spindle and Spin, Rinse, And Dry Module Including the Same". The disclosure of this application, which is assigned to Lam Research Corporation, the assignee of the subject application, is incorporated herein by reference.

With continuing reference to FIG. 1, sleeve 110 is disposed in the central opening of hollow core spindle 102. The upper portion of sleeve 110 extends beyond hollow core spindle 102 and through the central opening of wedge 108 such that the upper end of sleeve 10 is flush with the top surface of wafer backside plate 114. Manifold 120 is disposed in the upper end of sleeve 110. Manifold 120 includes ports 120*a* that may be used to deliver fluids, e.g., air and chemistries, to the backside of wafer 116. These fluids may be supplied to manifold 120 through supply lines (not shown) housed in sleeve 110. Capacitance sensor 124 is provided on manifold 120, as described in more detail later. If desired, wafer presence sensor 122 (see FIG. 2) also may be affixed to manifold 120.

Figure 2:
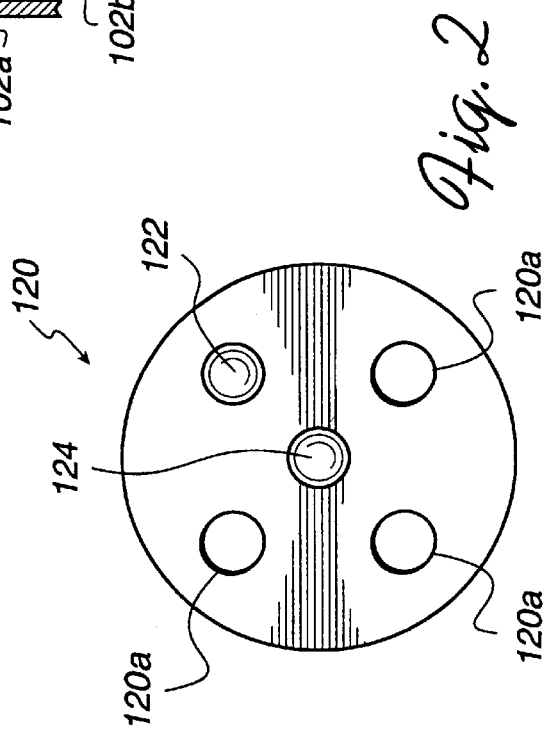
FIG. 2 is a simplified top plan view of the manifold shown in FIG. 1.

In accordance with one embodiment of the invention, capacitance sensor 124 is provided on manifold 120 to monitor the semiconductor wafer during a spin drying operation. FIG. 2 is a simplified top plan view of manifold 120 shown in FIG. 1. As shown in FIG. 2, capacitance sensor 124 is affixed to the central portion of manifold 120. Capacitance sensor 124 may be affixed to manifold 120 using any suitable technique. In one embodiment, capacitance sensor 124 is affixed to manifold 120 by embedding the capacitance sensor in the material from which the manifold is formed. Those skilled in the art will appreciate that the capacitance sensor may be either fully embedded or partially embedded in the manifold. Suitable capacitance sensors are commercially available from, e.g., Banner Engineering Corporation of Minneapolis, Minn. and Omron Corporation of Tokyo, Japan.

Figure 3:
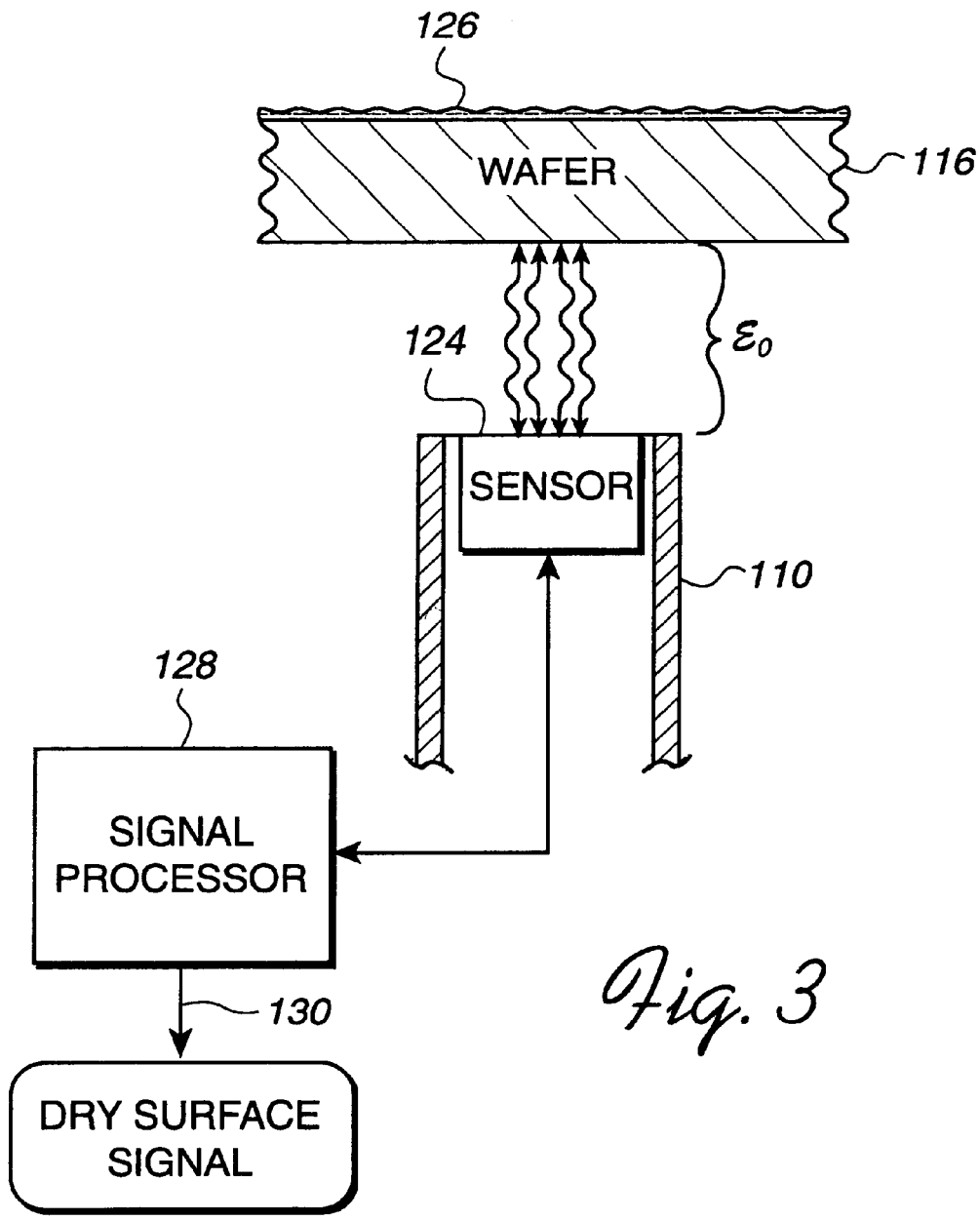
FIG. 3 is a simplified schematic diagram that illustrates an exemplary manner in which a semiconductor wafer may be monitored during a spin drying operation in accordance with one embodiment of the invention.

FIG. 3 is a simplified schematic diagram that illustrates an exemplary manner in which a semiconductor wafer may be monitored during a spin drying operation in accordance with one embodiment of the invention. As shown therein, capacitance sensor 124 transmits an analog energy signal toward the backside of wafer 116 and detects the energy concentrated between the capacitance sensor and the backside of the wafer. Based on the detected energy level, capacitance sensor 124 determines a capacitance value between wafer 116 and the capacitance sensor. The dielectric constant, $\epsilon_o$, is defined by the space between the backside of wafer 116 and the top surface of capacitance sensor 124. During a spin drying operation, the dielectric constant, $\epsilon_o$, changes as fluid film 126 is removed from the top surface of wafer 116. As shown in FIG. 3, wafer 116 has a fluid film on only the top surface thereof. In other spin drying operations, the wafer may have a fluid film on both the top and bottom surfaces of the wafer. The capacitance values determined by capacitance sensor 124 are continuously fed to signal processor 128, which is configured to generate signal 130 when the surface of the wafer is dry, as explained in more detail later. Signal 130 may be in any suitable form. In one embodiment, signal 130 is in the form of a flag that causes the motor to be stopped and thereby ends the spin drying operation.

Figures 4A, 4B:
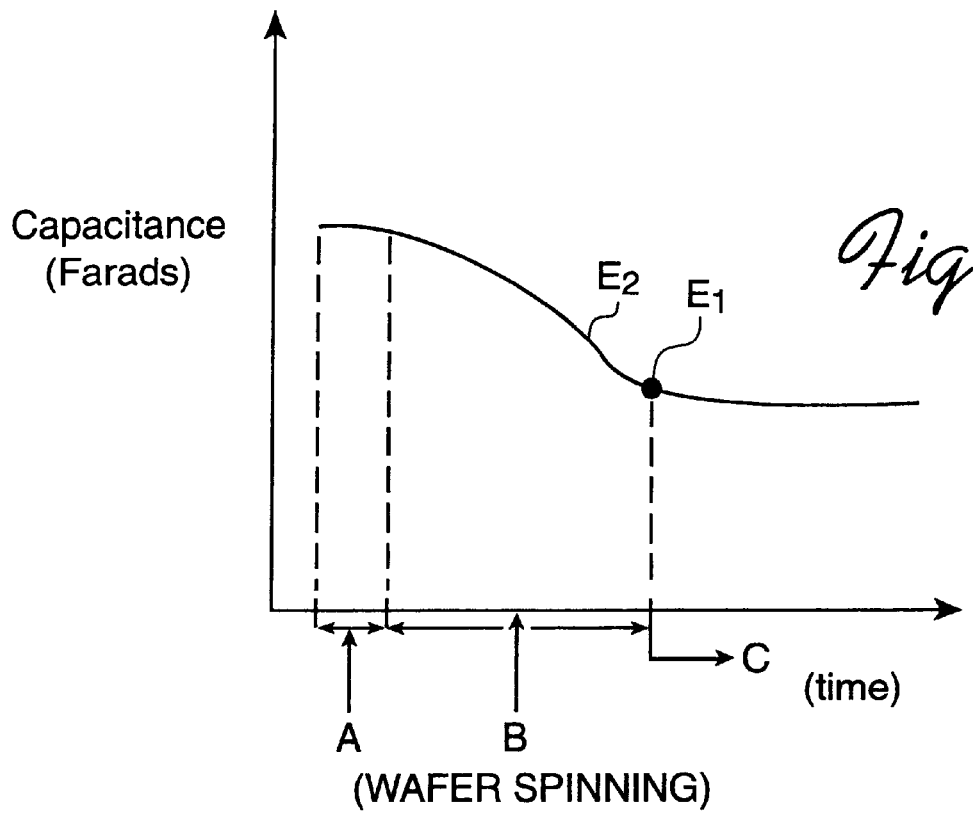
FIG. 4A is a graph of capacitance versus time for an exemplary spin drying operation.
FIG. 4B is a table that sets forth the status of the fluid film during stages A, B, and C shown in FIG. 4A.

FIGS. 4A and 4B illustrate how the capacitance values provided by the capacitance sensor may be used to determine when the surface of the wafer is dry in accordance with one embodiment of the invention. FIG. 4A is a graph of capacitance versus time for an exemplary spin drying operation. FIG. 4B is a table that sets forth the status of the fluid film during stages A, B, and C shown in FIG. 4A. As shown in FIG. 4A, in stage A, which is the period of time just before spinning of the wafer begins, the capacitance between the wafer and the capacitance sensor has a relatively high value due to the presence of the fluid film on the surface of the wafer. During stage B, which is the period of time during which the wafer is spinning, the capacitance decreases as the fluid film is removed from the surface of the wafer. In stage C, the capacitance remains at a substantially constant level because the fluid film has been removed from the surface of the wafer. Thus, the region near the onset of stage C, i.e., the region near the point at which the capacitance reaches a constant level, is a reliable indicator that the surface of the wafer is dry. Accordingly, in one embodiment of the invention, signal processor 128 (see FIG. 3) is configured to generate a signal when the measured capacitance value reaches a substantially constant level.

As used in connection with the description of the invention, the phrase "the measured capacitance value reaches a substantially constant level" means the point at which the measured capacitance value is no longer changing significantly with time. It will be apparent that the point at which the measured capacitance value is no longer considered to be changing significantly with time can be varied to suit the needs of particular situations. For example, this point can be defined as point $E_1$, which is the point at which the "flat" portion of the curve shown in FIG. 4A starts. At point $E_1$ and all points on the curve to the right of this point, the difference between successive measured capacitance values is essentially zero. Alternatively, the point at which the measured capacitance value is no longer considered to be changing significantly with time can be defined as point $E_2$, which occurs before point $E_1$ on the curve shown in FIG. 4A. At point $E_2$, the difference between successive measured capacitance values is slightly more than zero.

Figure 5B:
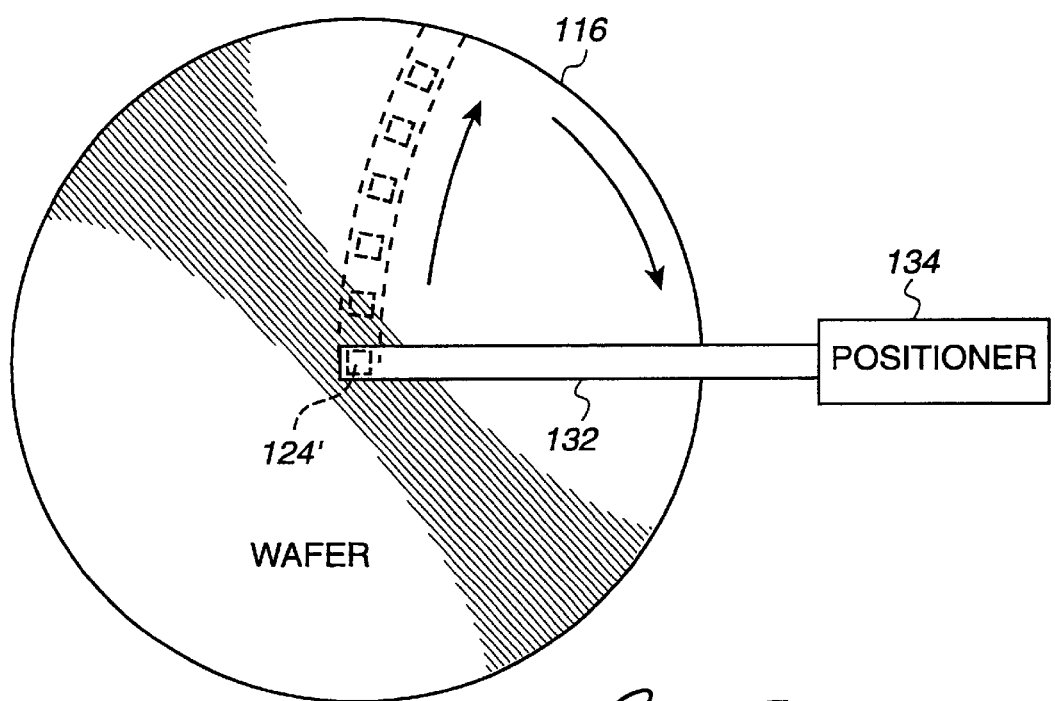
FIG. 5B is a simplified top view of an arm having a capacitance sensor mounted thereon coupled to a positioning device in accordance with one embodiment of the invention.

FIG. 5A is a side view, which shows some components in cross-section and other components in perspective view, of an arm having a capacitance sensor mounted thereon disposed above an exemplary chuck assembly in accordance with one embodiment of the invention. As shown therein, arm 132 having capacitance sensor 124' mounted thereon is disposed above wafer 116, which is held by grippers 118 of chuck assembly 100. The components of chuck assembly 100 are described above with reference to FIG. 1. Those skilled in the art will appreciate that spindle 102 shown in FIG. 1 has been omitted from FIG. 5. Arm 132 may be anchored to any suitable support member, e.g., a frame piece or wall of a spin, rinse, and dry module. In one embodiment, arm 132 is supported by a positioner, as described below with reference to FIG. 5B. Capacitance sensor 124' transmits an analog energy signal toward the top surface of wafer 116 and detects the energy concentrated between the capacitance sensor and the top surface of the wafer. Based on the detected energy level, capacitance sensor 124' determines a capacitance value between wafer 116 and the capacitance sensor. The capacitance values determined by capacitance sensor 124' are continuously fed to signal processor 128, which, as described above, generates signal 130 when the surface of the wafer is dry (signal processor 128 and signal 130 are shown in FIG. 3).

FIG. 5B is a simplified top view of an arm having a capacitance sensor mounted thereon coupled to a positioning device in accordance with one embodiment of the invention. As shown therein, arm 132 is pivotably coupled to positioner 134, which pivots arm 132 in the direction of the arrow so that capacitance sensor 124' mounted thereon "scans" the surface of wafer 116. The dashed lines in FIG. 5B denote the "scan" path followed by capacitance sensor 124'. It will be apparent to those skilled in the art that arm 132 may be moved relative to wafer 116 in other ways. For example, arm 132 may be rigidly coupled to positioner 134 and the positioner may be moved relative to wafer 116. In the case where positioner 134 pivots arm 132, the positioner may be mounted on any suitable support member, e.g., a frame piece or wall of a spin, rinse, and dry module. In the case where positioner 134 moves relative to wafer 116, the positioner may be mounted on a suitable drive track.

FIG. 6A is a side view, which shows some components in cross-section and other components in perspective view, of an arm having a plurality of capacitance sensors mounted thereon disposed above an exemplary chuck assembly in accordance with one embodiment of the invention. As shown therein, arm 132 having a plurality of capacitance sensors 124' mounted thereon is disposed above wafer 116, which is held by grippers 118 of chuck assembly 100. The use of multiple capacitance sensors 124' enables more of the surface of wafer 116 to be monitored. The capacitance values determined by each of capacitance sensors 124' are continuously fed to signal processor 128, which generates signal 130 when each of the capacitance sensors indicates that the surface of the wafer is dry (signal processor 128 and signal 130 are shown in FIG. 3).

Figure 6B:
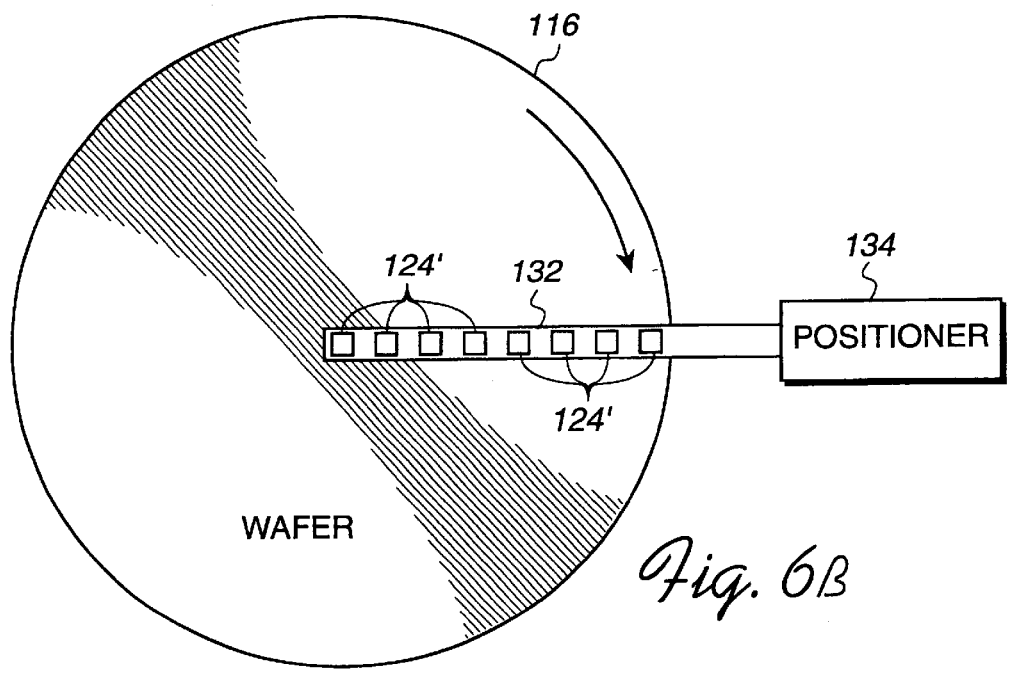
FIG. 6B is a simplified top view of an arm having a plurality of capacitance sensors mounted thereon coupled to a positioning device in accordance with one embodiment of the invention.

FIG. 6B is a simplified top view of an arm having a plurality of capacitance sensors mounted thereon coupled to a positioning device in accordance with one embodiment of the invention. As shown therein, arm 132 is pivotably coupled to positioner 134, which pivots arm 132 in the direction of the arrow so that each of capacitance sensors 124' mounted thereon "scans" the surface of wafer 116. The combination of the scanning movement of each of the multiple capacitance sensors and the rotation of the wafer makes it possible to monitor essentially the entire top surface of the wafer during a spin drying operation.

Figure 7:
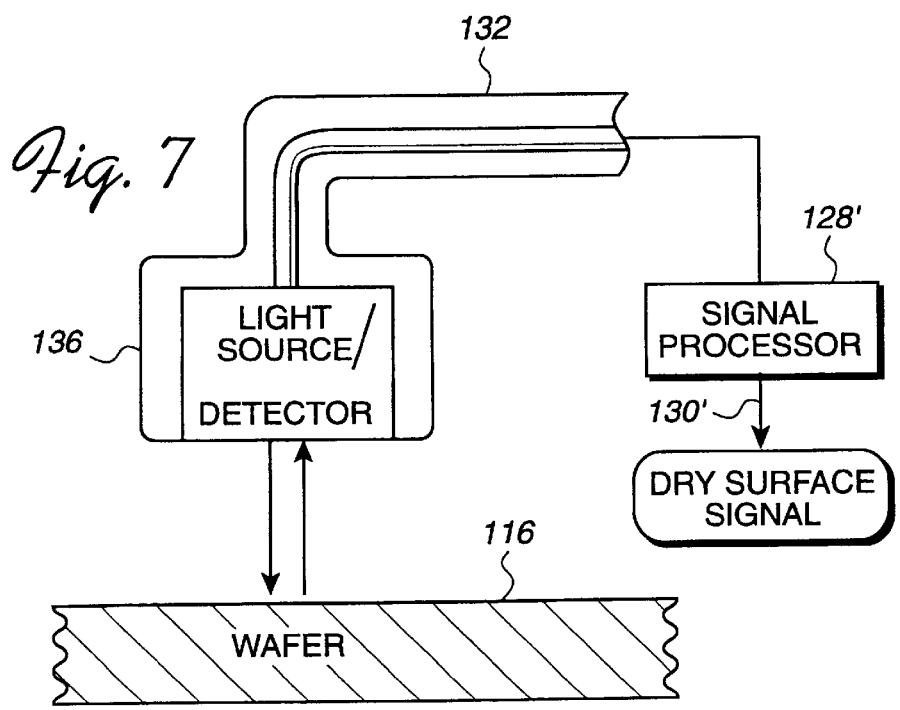
FIG. 7 is a simplified schematic diagram of an arm having an interferometric sensor mounted thereon in accordance with one embodiment of the invention.

FIG. 7 is a simplified schematic diagram of an arm having an interferometric sensor mounted thereon in accordance with one embodiment of the invention. As shown therein, interferometric sensor 136, which includes a light source and a detector, is mounted on arm 132. The light source directs light toward the top surface of wafer 116 such that the light that reflects off of the top surface is substantially perpendicular to the top surface. This orientation minimizes the effects of light scattering. The detector measures the intensity of the light that reflects off of the top surface of wafer 116.

It will be apparent to those skilled in the art that any suitable light source may be used in the interferometric sensor, e.g., a fiber optic transmitter, a laser, or a light emitting diode (LED). The light directed toward the surface of the wafer preferably has a wavelength in the range from about 100 nanometers (nm) to about 1,000 nm, and more preferably in the range from about 500 nm to about 850 nm. In one embodiment, the light has a wavelength of about 680 nm. The use of ultraviolet light is not preferred because it may lead to photoassisted corrosion of copper on wafer 116. Those skilled in the art are familiar with suitable detectors for measuring the intensity of the light that reflects off of the surface of wafer 116.

The intensity levels measured by interferometric sensor 136 are continuously fed to signal processor 128', which is configured to generate signal 130' when the surface of the wafer is dry. In one embodiment, signal processor 128' generates signal 130' when the measured intensity of the light reflected off of the surface of wafer 116 reaches an intensity level that corresponds to a measured intensity of light reflected off of the surface of the wafer when the surface is dry. The measured intensity of light reflected off of the surface of the wafer when the surface is dry may be determined in a calibration operation. The environmental conditions, e.g., humidity, under which this calibration operation is conducted should be the same as the environmental conditions under which the spin drying operation is to be performed. Otherwise, the measured intensity of light determined in the calibration operation may not be indicative of a thoroughly dry surface.

Those skilled in the art will recognize that arm 132 having interferometric sensor 136 mounted thereon may be pivoted so that the interferometric sensor "scans" the surface of wafer 116, as described above with reference to FIG. 5B for the capacitance sensors. In addition, a plurality of interferometric sensors 136 may be mounted on arm 132, as described above with reference to FIGS. 6A and 6B for the capacitance sensors.

In summary, the present invention provides methods for monitoring a semiconductor wafer during a spin drying operation, and methods and apparatus for spin drying a semiconductor wafer. The invention has been described herein in terms of several exemplary embodiments. Other embodiments of the invention will be apparent to those skilled in the art from consideration of the specification and practice of the invention. For example, those skilled in the art will recognize that the capacitance sensor may be used with a chuck assembly and spindle having a structure that is different than that of the exemplary chuck assembly and hollow core spindle described herein. In addition, it will be apparent to those skilled in the art that the interferometric sensor shown and described herein may be modified to detect the "endpoint" of a spin drying operation using ellipsometry, which involves the use of polarized light, or other suitable interferometric technique, instead of reflectometry. The embodiments and preferred features described above should be considered exemplary, with the scope of the invention being defined by the appended claims and their equivalents.

What is claimed is:

1. An apparatus for spin drying a semiconductor wafer, comprising:

a hollow core spindle having a central opening therethrough;

a chuck assembly mounted on the spindle, the chuck assembly having a central opening therethrough and including grippers for supporting a semiconductor wafer at an edge thereof;

a sleeve disposed in the central opening of the hollow core spindle, the sleeve being disposed such that an upper end thereof extends through the central opening of the chuck assembly;

a manifold disposed in the upper end of the sleeve; and a capacitance sensor affixed to the manifold, the capacitance sensor being configured to measure a capacitance value between the semiconductor wafer and the capacitance sensor.

2. The apparatus of claim 1, further comprising:

a processor for determining when the capacitance value measured by the capacitance sensor reaches a substantially constant level.

3. An apparatus for spin drying a semiconductor wafer, comprising:

a spindle;

a chuck assembly mounted on the spindle; the chuck assembly including grippers for supporting a semiconductor wafer at an edge thereof; and an arm having a capacitance sensor mounted thereon, the arm being positioned such that the capacitance sensor is disposed above a space to be occupied by a semiconductor wafer that is supported by the grippers, and the capacitance sensor being configured to measure a capacitance value between a semiconductor wafer supported by the grippers and the capacitance sensor.

4. The apparatus of claim 3, further comprising:

a processor for determining when the capacitance value measured by the capacitance sensor reaches a substantially constant level.

5. The apparatus of claim 3, wherein the arm is movable so that the position of the capacitance sensor relative to the space to be occupied by a semiconductor wafer that is supported by the grippers can be varied.

6. The apparatus of claim 3, wherein the arm has a plurality of capacitance sensors mounted thereon, each of the capacitance sensors being disposed above a space to be occupied by a semiconductor wafer that is supported by the grippers, and each of the capacitance sensors being configured to measure a capacitance value between a semiconductor wafer supported by the grippers and the capacitance sensor.

7. The apparatus of claim 6, further comprising:

a processor for determining when each of the capacitance values measured by the capacitance sensors reaches a substantially constant level.

8. The apparatus of claim 6, wherein the arm is movable so that the position of each of the capacitance sensors relative to the space to be occupied by a semiconductor wafer that is supported by the grippers can be varied.

9. An apparatus for spin drying a semiconductor wafer, comprising:

a spindle;

a chuck assembly mounted on the spindle; the chuck assembly including grippers for supporting a semiconductor wafer at an edge thereof; and an arm having a light source and a detector mounted thereon, the light source being positioned to direct light toward a surface of a semiconductor wafer being supported by the grippers such that light that reflects off of the surface of the semiconductor wafer is substantially perpendicular to the surface of the semiconductor wafer, and the detector being positioned to measure an intensity of the light reflected off of the surface of the semiconductor wafer.

10. The apparatus of claim 9, further comprising:

a processor for determining when the measured intensity of the light reflected off of the surface of the semiconductor wafer reaches an intensity level that corresponds to a measured intensity of light reflected off of the surface of the semiconductor wafer when the surface is dry.

11. The apparatus of claim 9, wherein the arm is movable so that the position of the light source and the detector relative to the surface of the semiconductor wafer can be varied.

12. The apparatus of claim 9, wherein the arm has a plurality of light sources and a corresponding number of detectors mounted thereon, each of the light sources being positioned to direct light toward a surface of a semiconductor wafer being supported by the grippers such that light that reflects off of the surface of the semiconductor wafer is substantially perpendicular to the surface of the semiconductor wafer, and each of the detectors being positioned to measure an intensity of the light from a corresponding light source that has reflected off of the surface of the semiconductor wafer.

13. The apparatus of claim 12, further comprising:

a processor for determining when each of the measured intensities of the light reflected off of the surface of the semiconductor wafer reaches an intensity level that corresponds to a measured intensity of light reflected off of the surface of the semiconductor wafer when the surface is dry.

14. The apparatus of claim 13, wherein the arm is movable so that the position of each of the light sources and each of the detectors relative to the surface of the semiconductor wafer can be varied.

* * * * *